(12) United States Patent
Motz et al.

(10) Patent No.: US 6,556,400 B1
(45) Date of Patent: Apr. 29, 2003

(54) REVERSE POLARITY PROTECTION CIRCUIT

(75) Inventors: Mario Motz, Wernberg (AT); Michael Besemann, Freiburg (DE)

(73) Assignee: Micronas GmbH, Freiburg (DE)

( * ) Notice: Subject to any disclaimer, the term of this patent is extended or adjusted under 35 U.S.C. 154(b) by 131 days.

(21) Appl. No.: 09/637,447

(22) Filed: Aug. 11, 2000

(30) Foreign Application Priority Data

Aug. 13, 1999 (DE) .......................... 199 38 403

(51) Int. Cl.⁷ ................................. H02H 3/42
(52) U.S. Cl. ........................... 361/84; 361/82
(58) Field of Search ................ 361/82, 84, 86, 361/18; 307/127; 257/403, 409

(56) References Cited

U.S. PATENT DOCUMENTS

| | | | |
|---|---|---|---|
| 4,423,456 A | | 12/1983 | Zaidenweber |
| 4,839,769 A | * | 6/1989 | Soo et al. ................ 361/84 |
| 4,958,251 A | * | 9/1990 | Ciini et al. ............... 361/84 |
| 4,987,465 A | * | 1/1991 | Longcor et al. ......... 357/23.13 |
| 5,126,911 A | * | 6/1992 | Cintiero et al. .......... 361/84 |
| 5,530,394 A | | 6/1996 | Blossfeld et al. |
| 5,764,465 A | * | 6/1998 | Mattes et al. ............ 361/77 |

FOREIGN PATENT DOCUMENTS

| | | |
|---|---|---|
| DE | 35 35 788 | 2/1986 |
| DE | 39 30 896 | 3/1991 |
| DE | 197 45 074 | 4/1999 |
| EP | 0 217 525 | 4/1987 |
| EP | 0 305 936 A2 * | 3/1989 ............ H02H/3/18 |
| EP | 0 918 398 | 5/1999 |
| FR | 2 629 284 | 9/1989 |
| WO | WO 98/13922 | 4/1998 |

OTHER PUBLICATIONS

Zetex, ZXM62N03E6, 30V N–Channel enhancement mode MOSFET, Data Sheet, May, 1999.*
097 Low–drop Verpolschutz; Elektor 7–8/1994, pp. 122–123.

* cited by examiner

Primary Examiner—Brian Sircus
Assistant Examiner—Zeev Kitov
(74) Attorney, Agent, or Firm—Gudrun E. Huckett

(57) ABSTRACT

A circuit member has an inner switching arrangement having an operating voltage line and a ground connecting line connecting on a switching circuit a ground contact to the inner switching arrangement. A reverse polarity protective device has a protective transistor arranged in the ground connecting line. During normal operation, defined by having an operating voltage applied to the operating voltage line and by having a ground potential applied to the ground connecting line, the protective transistor is in a conducting state. In a reverse polarity situation, defined by having the operating voltage applied to the ground connecting line and by having the ground potential applied to the operating voltage line, the protective transistor is in a non-conducting state. The protective transistor is configured to carry a high operational voltage in the reverse polarity situation.

16 Claims, 1 Drawing Sheet

REVERSE POLARITY PROTECTION CIRCUIT

BACKGROUND OF THE INVENTION

1. Field of the Invention

The invention relates to a circuit member comprising an operating voltage line, a ground connecting line, and a reverse polarity protection device.

2. Description of the Related Art

Such a circuit member is, for example, provided in integrated switching circuits as they are used, for example, as sensors in the automobile industry (compare in this context the patent application EP 0 648 019 A2 of the same applicant). The on-board voltages in the motor vehicle field are generally predetermined by the battery voltage of 12 volt. In real operation, however, considerable deviations of this value upwardly and downwardly can result. The operating voltages that have to be considered in this context can be between 5 volt and up to 24 volt, or even outside of the limits. By external and/or internal protective measures, such as, for example, internal voltage stabilizing devices and an increased voltage stability of the circuit member by means of an adapted circuit member design as well as use of internal overvoltage protection devices, these high operational voltages are permissible. However, when especially at high operational voltages the contacts for the operating voltage and for the ground are accidentally switched so that at the operating voltage line the ground potential and at the ground connecting line the operating voltage is applied, respectively, the circuit member can be destroyed or damaged, for example, due to a thermal overload by currents that are too great in breakthrough situation, or the transistors can be damaged by too great a stress voltage, if no further protective measures are provided. The circuit member known from EP 0 648 019 A2 is provided with a certain protection against such a reverse polarity in that the reverse polarity current is limited by an internal or external resistor.

SUMMARY OF THE INVENTION

It is an object of the present invention to develop the protective device of the aforementioned kind such that even for those circuit members, in which the application of the known aforementioned protective devices is impossible, a protection against reverse polarity is made possible. Furthermore, the further development together with the actual switching circuit should be monolithically integratable, so that external reverse polarity protective devices can be eliminated and overvoltages in the reverse polarity situation are harmless for the entire circuitry.

In accordance with the present invention, this is achieved in that the reverse polarity protective device is a transistor connected within the ground connecting line which on a switching circuit provides a ground connection to an inner switching arrangement. This transistor during normal operation, which is defined by having the operational voltage applied to the operating voltage line and having the ground potential applied to the ground connecting line, is in a conducting state, and in the reverse polarity situation, which is defined by having the operating voltage applied to the ground connecting line and having the ground potential applied to the operating voltage line, is in a non-conducting state, wherein the transistor is able to receive in the reverse polarity situation a high operating voltage.

The principle of the invention is that a transistor is additionally provided on the chip between the inner ground contact (this refers to the conventional ground contact on the chip of the monolithically integrated circuit member) and the contact for the internal ground. During normal operation, the transistor should be conducting and in the reverse polarity situation, i.e., when applying the operating voltage to the ground connecting line and the ground potential to the operating voltage line, should be non-conducting. Accordingly, the erroneously applied operating voltage cannot be applied to the actual switching circuit so that the switching circuit is now protected and cannot be destroyed. In order not to destroy the transistor in the reverse polarity situation even at high voltages, it is designed as a high voltage transistor. A significant advantage of this protected device is that no current will flow in the reverse polarity situation.

For achieving the conducting state and the non-conducting state of the transistor, a further development of the invention provides that a control electrode is coupled with the one operating voltage line or directly connected thereto. Accordingly, the voltage value on the operating voltage line controls directly the function of the transistor.

A preferred embodiment of the invention for a standard CMOS (complementary metal oxide silicon) manufacturing process proposes that the transistor serving as a reverse polarity protective device is embodied as a MOS (metal oxide silicon) transistor with an n-conducting channel. Its source and drain electrodes, as is conventional, are embedded in relatively highly doped regions which are of the opposite conductivity type as the p-conducting substrate. The transistor region which during normal operation, i.e., without reverse polarity, serves as the source region is embedded in a relatively weakly doped tub-shaped n-well which is arranged laterally and below the source region and is of the same conductivity type as the transistor and of the opposite conductivity type as the substrate. During normal operation, i.e., without reverse polarity, a conducting channel is formed between the source and the drain. The transistor is thus conducting and, with a suitably dimensioned design, almost no voltage drop occurs across its drain-source path. In the reverse polarity situation the source becomes the drain and the drain becomes the source, and the transistor is thus switched off by its control electrode so that a conducting channel is no longer present. The applied operating voltage thus will drop essentially across the weakly doped tub-shaped n-well so that on the sensitive gate oxide no critical field strength will occur which could result in damage of the transistor.

According to a further embodiment of the invention the transistor is an n-chanel MOSFET (metal oxide silicon field effect transistor) of the enhancement type wherein advantageously the tub-shaped well for embedding the source region (source being related to the normal operating situation without reverse polarity) is relatively weakly doped, for example, n--doped. It is also conceivable to provide a further transistor for protection against reverse polarity not only in the ground connecting line but in addition also in the operating voltage line. This transistor is then of a different conducting type, i.e., a p-channel MOSFET.

The signal outputs of the inner circuit arrangement with the correlated transistors are also protected by the aforementioned transistor, disclosed as one embodiment according to the invention, against reverse polarity of the operating voltage. According to a further embodiment for protecting the inner switching arrangement against reverse polarity of the supply connectors, a DMOS transistor (diffused metal oxide silicon), which generally has also the desired high-voltage compatibility, is also suitable when also integratable.

DESCRIPTION OF THE PREFERRED EMBODIMENTS

Figure 1:
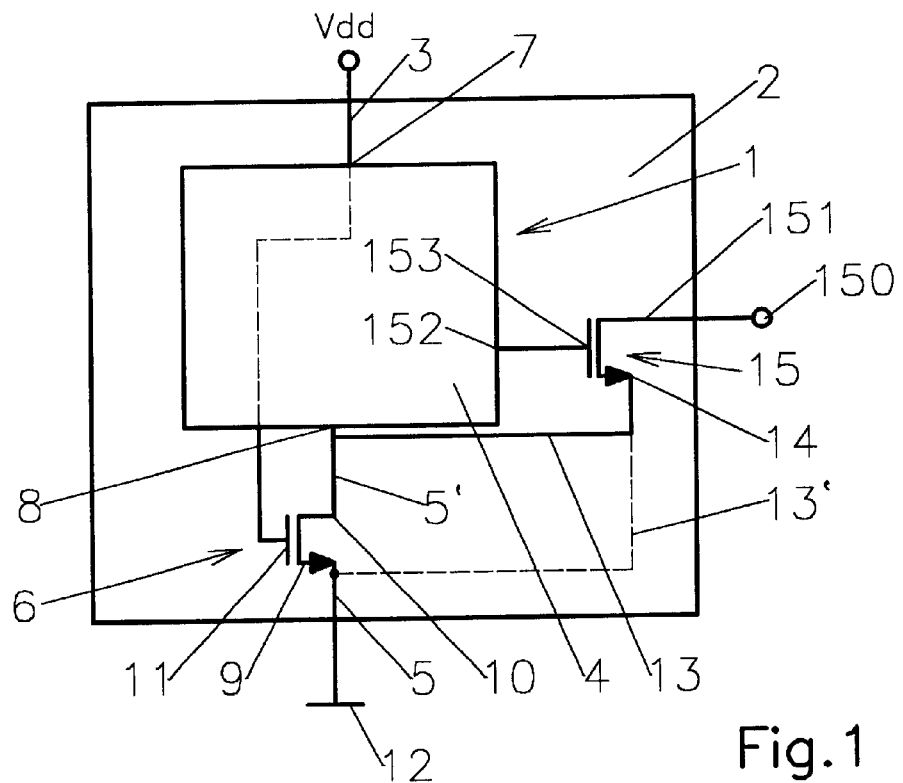
FIG. 1 shows the circuit member according to the invention.

The circuit member illustrated in FIG. 1 is arranged within a switching circuit 2 which is, in particular, a monolithic-integrated switching circuit 2. The circuit member 1 comprises an operating voltage line 3, an internal switching arrangement 4 to be protected, a ground connecting line 5, and a protective transistor 6 as a reverse polarity protective device. The operating voltage line 3 is connected to an input 7 of the internal switching arrangement 4. An output 8 of the internal switching arrangement 4 is connected via the protective transistor 6 with the ground connecting line 5. The protective transistor 6 has a source electrode 9, a drain electrode 10, and a gate electrode 11. The source electrode 9 is connected via the ground connecting line 5 with the contact for an external ground 12. The drain electrode 10 is connected via the line 5' with the contact 8 for the "inner ground" of the internal switching arrangement 4. The gate electrode (control electrode) 11 is coupled to the internal switching arrangement 4 and carries, for example, the positive operating voltage Vdd as a control potential during normal operation.

Moreover, according to a further development of the invention which concerns at least one signal output 150 of the switching circuit 2, in the embodiment according to FIG. 1, the drain electrode 10 of the protective transistor 6 is connected via a line 13 with a source contact 14 of an output transistor 15 which has an open drain output 151 and whose gate electrode is connected with the signal output 152 of the circuit member 1. When the circuit member has further signal outputs, these outputs can be protected in the same way against the destructive effects of the reverse polarity of the operating voltage.

Figure 2:
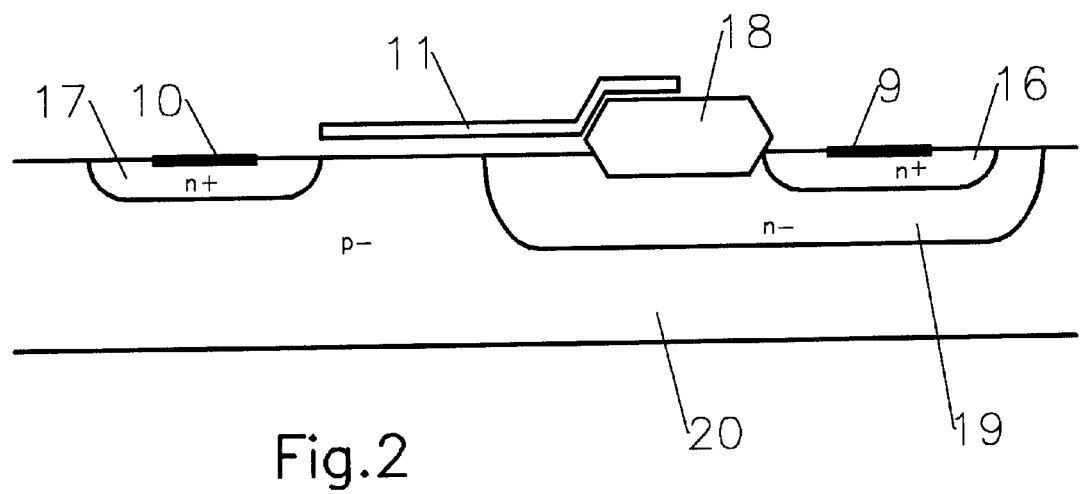
FIG. 2 illustrates a cross-section of the transistor used in the circuit member according to FIG. 1.

The protective transistor 6, illustrated in FIG. 2 in a sectional view, is an n-channel MOSFET of the enhancement type which is, for example, suitable for use in the switching arrangement according to FIG. 1. In the sectional representation an n+-doped source region 16 is illustrated below the source electrode 9 which is to be connected to the ground connecting line 5. The term "below" refers in this description to the designation of the vertical correlation of the different semiconductor regions in the conventional cross-sectional representation. This means generally that the upper area is laterally and vertically embedded in the lower region. Below the drain electrode 10 which is to be connected to the ground connecting line 5', an n+-doped drain region 17 is arranged. The gate electrode 11 is positioned insulated between the source electrode 9 and the drain electrode 10. For insulation purposes, a field oxide layer 18 is arranged between the gate electrode 11 and the source region 16. The n-conducting source region 16 and the field oxide layer 18 are positioned adjacent to one another in an n--doped tub-shaped well 19 which is arranged in a p--substrate 20. During normal operation the resulting barrier layer between the tub-shaped well 19 and the substrate 20 is blocked so that the source region 16 is insulated from the substrate 20.

During normal operation the positive operating voltage Vdd, or a portion of the positive operating voltage, is coupled via the internal switching arrangement 4 with the gate electrode 11. The n-channel protective transistor 6 is thus conductive and becomes conducting so that the contact 8 of the internal switching arrangement 4 is also substantially connected to ground via the source electrode 9 connected to the contact 12 for the external ground and the drain-source path of the protective transistor 6.

When now a reverse polarity at the contacts occurs so that ground potential is applied to the operating voltage line 3 and the positive operating voltage Vdd is applied to the contact 12 of the external ground, the source electrode 9 of the protective transistor 6 becomes a drain electrode and the drain electrode 10 becomes a source electrode. The electrode 9 correlated with the tub-shaped well 19 now represents the drain electrode in the reverse polarity situation. On the gate electrode 11 as well as on the operating voltage line 3 ground potential is also applied so that the n-channel protective transistor 6 is blocked. Accordingly, the contact 8 of the switch arrangement 4 is separated from the operating voltage Vdd, which is applied with reverse polarity and is possibly also too high, and a destruction of the internal switching arrangement 4 cannot take place. The operating voltage thus drops across the drain source path 12, 10 of the protective transistor 6. In order to prevent the protective transistor 6 from becoming destroyed itself by the applied and optionally too high operating voltage, the n+-region 18 is provided with the already described, weakly doped tub-shaped n--well 19 is provided in which, as the case may be, too great a field strength between the electrode 9 and the ground potential on the gate electrode 11 can be dissipated in the reverse polarity situation.

The protection of the at least one output transistor 15, whose gate electrode 153 is controlled by an internally located signal output 152, is realized by the protective transistor 6 of FIG. 1. The source electrode 14 of the output transistor 15 which is, for example, operated as an open drain circuit is separated by the protective transistor 6 from the reverse polarity voltage on the contact 12 and thus only carries voltages in the range of the ground potential. The output transistor 15 is thus protected against reverse polarity of the operating voltage and the overvoltages possibly occurring in this context.

A further embodiment for protecting the signal output transistor 15 resides in that this output transistor 15 is configured substantially like the protective transistor 6, see, for example, the sectional representation of FIG. 2. For this embodiment variant the source contact 14 of this output transistor 15 is no longer connected with the drain contact 10 of the protective transistor 6 but directly with the contact 12 for the ground (the connecting specifications refer in this context to the operational situation without reverse polarity). In the switching circuit example of FIG. 1 this connection type is illustrated by a dashed source-ground connecting line 13' for the output transistor 15. The protective effect of the protective transistor 6 is thus no longer required for protecting the output transistor 15, but is still required for the internal switching arrangement 4. The output transistor 15 may also be a DMOS transistor, as in the case of the protective transistor 6, which in the reverse polarity situation can also withstand a high reverse polarity voltage.

While specific embodiments of the invention have been shown and described in detail to illustrate the inventive principles, it will be understood that the invention may be embodied otherwise without departing from such principles.

What is claimed is:

1. A circuit member (1) comprising:
    an inner switching arrangement (4) having an operating voltage line (3) and a ground connecting line (5)

configured to connect on a switching circuit (2) a ground contact (12) to said inner switching arrangement (4);

a reverse polarity protective device comprising a protective transistor (6) arranged in said ground connecting line (5);

wherein during normal operation, defined by having an operating voltage (Vdd) applied to said operating voltage line (3) and by having a ground potential applied to said ground connecting line (5), said protective transistor (6) is in a conducting state;

wherein in a reverse polarity situation, defined by having said operating voltage (Vdd) applied to said ground connecting line (5) and by having said ground potential applied to said operating voltage line (3), said protective transistor (6) is in a non-conducting state; and wherein said protective transistor (6) is configured to carry a high operational voltage in said reverse polarity situation;

wherein said protective transistor (6) is a MOSFET comprising in said normal operation a drain, a source, and a gate, wherein said source comprises a source region (16) with a source electrode (9) embedded in a tub-shaped well (19), wherein said tub-shaped well (19) is of identical conductivity type as said protective transistor (6) but of opposite conductivity type as a substrate (20) of said protective transistor (6); and an output transistor (15) having a source electrode (14) configured to be directly connected to a drain electrode (10) of said drain of said protective transistor (6) during normal operation.

2. The circuit member according to claim 1, wherein said protective transistor (6) has a control electrode (11) coupled to said operating voltage line (3).

3. The circuit member according to claim 1, wherein said protective transistor (6) is a MOSFET of the enhancement type.

4. The circuit member according to claim 3, wherein said protective transistor (6) is an n-channel transistor.

5. The circuit member according to claim 1, wherein said reverse polarity protective device further comprises a p-channel MOSFET arranged in said operating voltage line (3).

6. The circuit member according to claim 1, wherein said protective transistor (6) comprises a drain electrode (10) and wherein said substrate (20) during said normal operation is coupled to said drain electrode (10).

7. The circuit member according to claim 1, wherein said tub-shaped well (19), in comparison to said source region (16) or a drain region (17) of said drain, is weakly doped.

8. The circuit member according to claim 7, wherein said tub-shaped well (19) is n--doped.

9. A circuit member comprising:

an inner switching arrangement (4) having an operating voltage line (3) and a ground connecting line (5) configured to connect on a switching circuit (2) a ground contact (12) to said inner switching arrangement (4);

a reverse polarity protective device comprising a protective transistor (6) arranged in said ground connecting line (5);

wherein during normal operation, defined by having an operating voltage (Vdd) applied to said operating voltage line (3) and by having a ground potential applied to said ground connecting line (5), said protective transistor (6) is in a conducting state;

wherein in a reverse polarity situation, defined by having said operating voltage (Vdd) applied to said ground connecting line (5) and by having said ground potential applied to said operating voltage fine (3), said protective transistor (6) is in a non-conducting state; and wherein said protective transistor (6) is configured to carry a high operational voltage in said reverse polarity situation;

wherein said protective transistor (6) is a MOSFET comprising in said normal operation a drain, a source, and a gate, wherein said source comprises a source region (16) with a source electrode (9) embedded in a tub-shaped well (19), wherein said tub-shaped well (19) is of identical conductivity type as said protective transistor (6) but of opposite conductivity type as a substrate (20) of said protective transistor (6);

an output transistor (15) having a source electrode (14) configured to be directly connected to the ground contact (12) during normal operation; and wherein said output transistor (15) and said protective transistor (10) are substantially identically configured to be switched off in said reverse polarity situation and to receive an overvoltage between a drain-source path.

10. The circuit member according to claim 9, wherein said protective transistor (6) has a control electrode (11) coupled to said operating voltage line (3).

11. The circuit member according to claim 9, wherein said protective transistor (6) is a MOSFET of the enhancement type.

12. The circuit member according to claim 11, wherein said protective transistor (6) is an n-channel transistor.

13. The circuit member according to claim 9, wherein said reverse polarity protective device further comprises a p-channel MOSFET arranged in said operating voltage line (3).

14. The circuit member according to claim 9, wherein said protective transistor (6) comprises a drain electrode (10) and wherein said substrate (20) during said normal operation is coupled to said drain electrode (10).

15. The circuit member according to claim 9, wherein said tub-shaped well (19), in comparison to said source region (16) or a drain region (17) of said drain, is weakly doped.

16. The circuit member according to claim 9, wherein said tub-shaped well (19) is n-doped.

\* \* \* \* \*